United States Patent [19]

Schmidt et al.

[11] Patent Number: 5,382,505

[45] Date of Patent: Jan. 17, 1995

[54] METHOD OF MAKING A LAMINATED STRUCTURE WITH SHEAR FORCE DELAMINATION RESISTANCE

[75] Inventors: Walter Schmidt, Zürich; Marco Martinelli, Neftenbach, both of Switzerland

[73] Assignee: Dyconex AG, Zürich, Switzerland

[21] Appl. No.: 854,884

[22] Filed: Mar. 20, 1992

[30] Foreign Application Priority Data

Apr. 10, 1991 [CH] Switzerland ............... 01 063/91-0

[51] Int. Cl.⁶ .................................................. G03C 5/00
[52] U.S. Cl. ................................... 430/313; 430/315; 430/318; 430/323; 430/324; 156/659.1; 156/664; 156/666
[58] Field of Search ............... 430/324, 315, 313, 318, 430/323; 156/659.1, 664, 666

[56] References Cited

U.S. PATENT DOCUMENTS

| | | | |
|---|---|---|---|
| 3,177,103 | 4/1965 | Tally et al. | 156/3 |
| 3,791,858 | 2/1974 | McPherson et al. | 117/201 |
| 3,832,176 | 8/1974 | Verstraete et al. | 430/324 |
| 4,086,114 | 4/1978 | Karol | 156/153 |
| 4,328,298 | 5/1982 | Nester | 430/324 |
| 4,446,188 | 5/1984 | Patel et al. | 428/138 |
| 4,456,500 | 6/1984 | Ibata | 430/318 |
| 4,745,795 | 7/1988 | Bakos et al. | 430/313 |

FOREIGN PATENT DOCUMENTS

| | | | |
|---|---|---|---|
| 0016952 | 10/1980 | European Pat. Off. | |
| 0393312 | 10/1990 | European Pat. Off. | |
| 0476664 | 3/1992 | European Pat. Off. | 156/664 |
| 2080729 | 2/1982 | United Kingdom . | |

*Primary Examiner*—Charles L. Bowers, Jr.
*Assistant Examiner*—J. Pasterczyk
*Attorney, Agent, or Firm*—Walter C. Farley

[57] ABSTRACT

The surface of a metal foil to be used as an intermediate layer in printed circuit boards is chemically roughened. In one embodiment, fine depressions are etched out of the metal coating. In another embodiment, protuberances are plated thereon. The use of the method permits the use of the foil in the production of multilayer printed circuit boards with coatings having different thermal expansion characteristics and improves the adhesion with the next conductor layer applied thereto to a significant extent and prevents delamination.

10 Claims, 4 Drawing Sheets

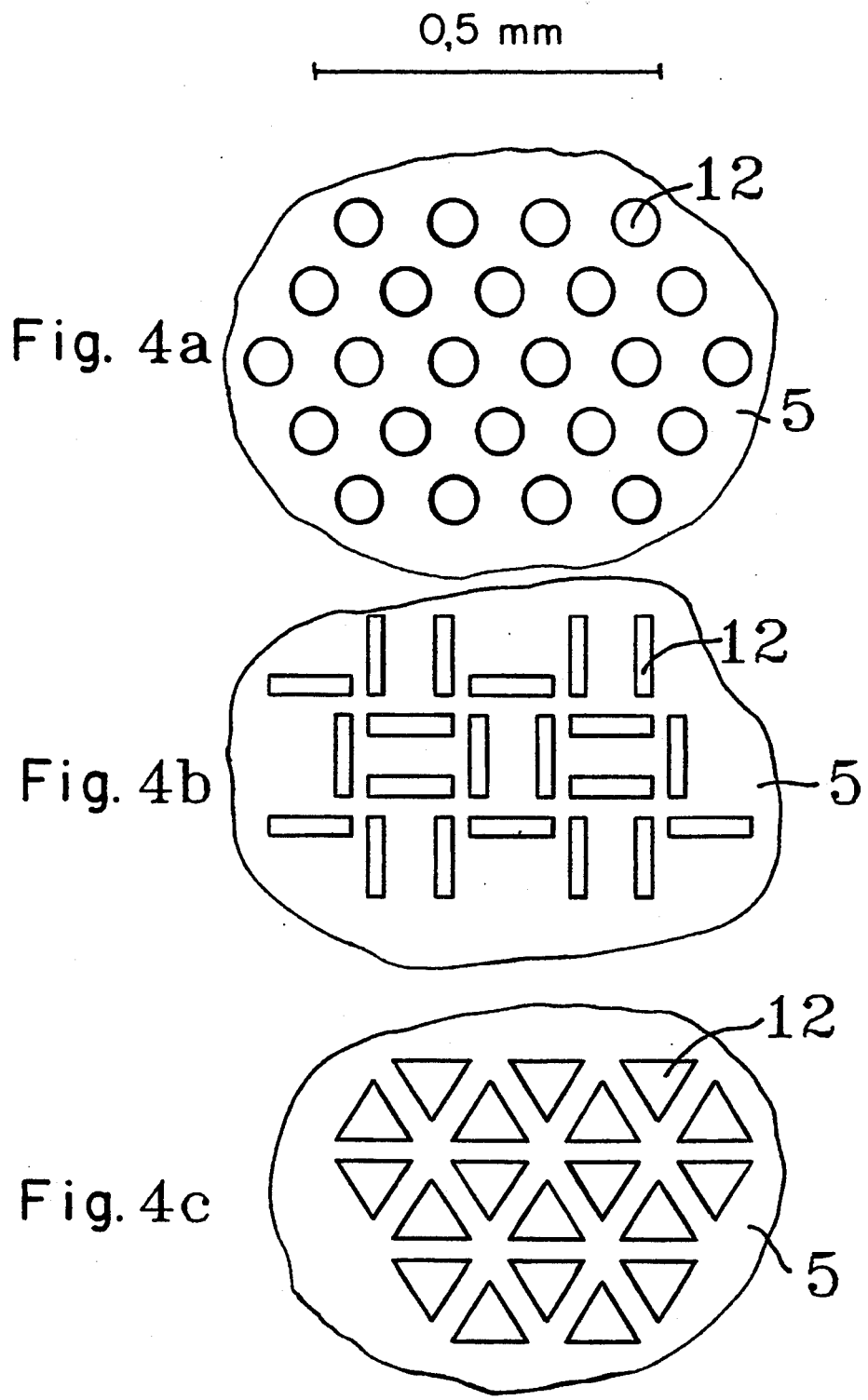

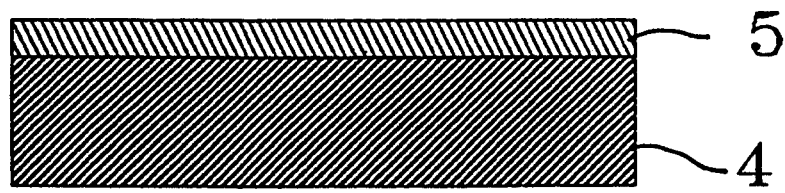
Fig. 5a
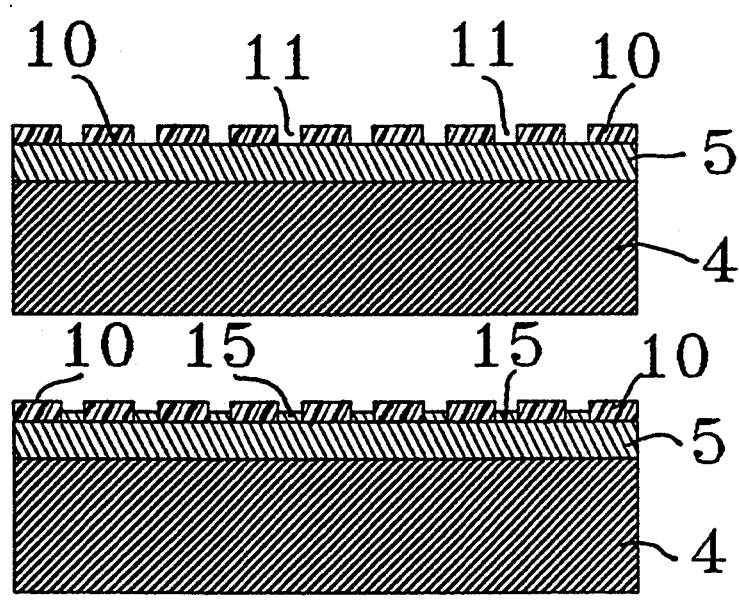
Fig. 5b
Fig. 5c
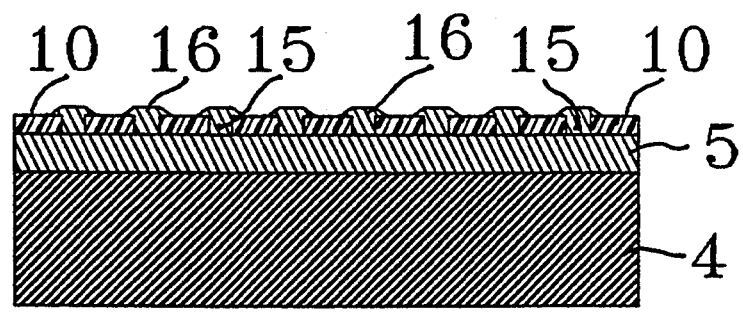
Fig. 5d
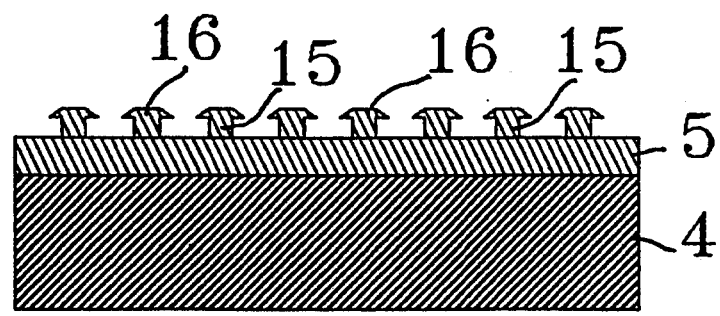
Fig. 5e

METHOD OF MAKING A LAMINATED STRUCTURE WITH SHEAR FORCE DELAMINATION RESISTANCE

FIELD OF THE INVENTION

The invention relates to the field of connection carriers for electronic components and specifically relates to the structuring of the surface of a metal foil in conjunction with a method for the production of a multilayer, laminated printed circuit board, as well as to a printed circuit board produced by this method.

BACKGROUND OF THE INVENTION

Printed circuit boards for producing electronic circuits carry and connect electronic components, compactness and high interconnection density being sought. It therefore forms part of the prior art to directly solder onto the surface connection layer of printed circuit boards integrated circuits in the form of surface mounted devices (abbreviated SMD) or leadless chip carriers (abbreviated LCC). The printed circuit boards generally have a multilayer construction, i.e. they have several conductor layers.

The reliability of SMDs soldered onto a printed circuit board is greatly reduced if the thermal expansion coefficient of the components differs significantly from that of the printed circuit board. Different thermal expansions of the board and components leads to high shear stresses at the soldered joints, which can then lead to cracks. The problem does not occur to the same extent when using components having metal leads, because the latter serve as flexible intermediate members between the board and the component and in this way the stresses can be compensated.

As a function of the materials used, conventional printed circuit boards have a thermal expansion coefficient of 15 to 20 ppm/° C., but the coefficient approximately 6 ppm/° C. for components in ceramic packages without leads, i.e. leadless ceramic chip carriers (LCCC). The use of LCCC's consequently requires printed circuit boards whose thermal expansion is reduced by suitable measures, so that the stresses are limited to an acceptable amount.

Standard measures for reducing the thermal expansion of printed circuit boards are the fitting of cores or intermediate layers of thermally stable materials. For example metal sheets or foils formed from a combination of copper and an alloy sold under the trademark INVAR TM (an alloy of nickel and iron with a very low expansion coefficient), of molybdenum (with a thermal expansion coefficient of approximately 5 ppm/° C.) or cores with a carbon fiber reinforcement are known. Further information on this problem are provided by EP-A-393312 which is assigned to the assignee of this application.

As a result of these measures the composite of thermally stable reinforcement and conductor layers, i.e. the printed circuit board, acquires an adapted, low expansion factor and in this way the thermal stresses at the soldered joints are reduced. However, it leads to a new problem. Because of temperature changes, shear stresses act at the interface between the cores or intermediate layers of the thermally more stable materials and the remaining layers of the printed circuit board. This occurs because the cores or intermediate layers, due to their high mechanical strength, force the board to remain dimensionally stable, whereas the remaining layers of the board, having the tendency to expand or contract more with the temperature change, are subject to a restriction of their freedom of movement because of their adhesive attachment to the cores or intermediate layers. If untreated intermediate layers are laminated together with conductor layers to form a printed circuit board, due to the normal temperature cycles, delamination must be expected, i.e. the union between the conductor layer and the intermediate layer is broken. This separation can in particular be observed if glass fibre-reinforced polyimide resin is used as the laminate base material. However, poor results are also obtained with base materials from cyanate ester resins.

Solutions for overcoming this problem are also known. The surfaces of the metal foils (copper/IN-VAR TM, copper/molybdenum) are pretreated by black oxidation, sand blasting or the application of a treatment coating. The normally used black oxidation is admittedly sufficient to prevent the delamination of glass fibre-reinforced epoxy materials, but is not sufficient in the case of polyimide or cyanate ester resin base materials. The necessary adhesion coefficients are also not provided by sand blasting. There also is a process in which an additional coating, normally of copper, is so electrodeposited on the stabilizing intermediate layer, that a rough surface is obtained. However, this process is complicated and expensive. It is always used over the entire surface, so that no desired or even necessary recesses are possible. The product also suffers from the disadvantage of being sensitive to pressure and scratching and cannot subsequently undergo photochemical processing.

SUMMARY OF THE INVENTION

An object of the invention is to find a measure for preventing the delamination of coatings having different thermal expansion characteristics in a laminated, multilayer printed circuit board, without having to accept the aforementioned inadequacies and disadvantages. This object is achieved by a special structuring of the surface of metal foils and the assembly of the foils in the printed circuit boards.

The materials now used for cores or intermediate layers normally have an outermost coating of electrically and thermally conductive, electroplatable metal, particularly copper. However, it is also possible to obtain foils made solely from INVAR TM or solely from molybdenum. The invention therefore aims at improving the adhesion between the outer metal surface and the conductor layer to be applied thereto. This can be efficiently and inexpensive achieved in that the surface of the metal coating is given a fine structure by photochemical treatment. The photochemical process makes it possible using per se known means in a few, relatively uncomplicated operations to obtain a fine and almost randomly selectable pattern of etched-out depressions and/or electrodeposited on protuberances. Structured in this way the contact surface between the metal and the connecting material of the next, laminated-on layer, normally a resin, is much larger than with the untreated metal coating, which increases the overall adhesiveness. The largely freely selectable shape of the depressions and protuberances also makes it possible to effectively counteract on an overall basis the shear forces directed parallel to the surface. The production of patterns for photomasks can take place in a very simple manner by providing a basic element of the pattern and then repeating it in a computer assisted manner. It is also easy to make different patterns in the same mask and in particular larger parts can be excluded from the patterning with random boundaries.

The invention has the advantage of being based on standard technology. It can be used in virtually any printed circuit board fabrication without special means having to be used. The process is also much less expensive than "treating" copper surfaces. The product is robust with respect to scratches and compressive loads and can be treated and further processed in the same way as a normal copper surface. Where it is possible to work with conventional-metal and in particular copper-coated foils, the etching out of depressions also has the positive effect of weakening the lateral cohesion of the outer metal coating, so that the inner, thermally more stable coating can better develop its dimensional stabilization action.

BRIEF DESCRIPTION OF THE DRAWING

The invention is described in greater detail hereinafter with reference to the following drawings using the example of a single copper coating to be treated on a copper/INVAR TM /copper foil. However, it should be understood that this does not constitute a restriction. The method can also be used on other foils and metal coatings, structuring can take place in the same operation on both sides and, for the same printed circuit board, the treatment for the different coatings is performed as often as is necessary. In the drawings.

FIGS. 4a–4c are partial plan views of a portion of a surface produced in accordance with the method of FIGS. 3a–3d; and FIGS. 5a–5e are enlarged side elevations of layers of a printed circuit board showing steps of a further embodiment of the invention referred to as an additive technique.

DESCRIPTION OF THE PREFERRED EMBODIMENTS

Figure 1:
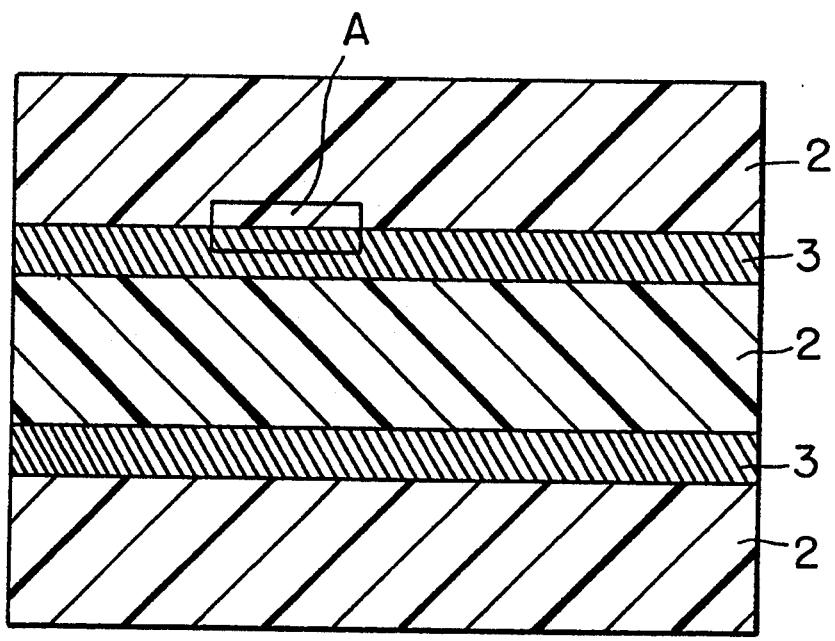
FIG. 1 is a side elevation, in section, of a portion of a multiple-layer printed circuit board.

FIG. 1 shows an example of a multilayer, laminated printed circuit board, whose thermal expansion is kept within limits by the incorporation of two metal foils 3 each having a low thermal expansion coefficient which is, as a function of the structure, approximately 1 to 6 ppm/° C. Such foils can e.g. comprise a molybdenum or INVAR TM coating with a copper or copper-nickel coatings of varying thickness rolled onto one or both sides. Between the two foils 3 and on the two outer faces is in each case provided a generally multilayer conductor 2, whose thermal expansion coefficient is between approximately 12 and 20 ppm/° C. The average thermal expansion coefficient for the entire printed circuit board is then 7 to 10 ppm/° C. There is a delamination risk in the case of temperature changes at the contact surface where the metal foil 3 and the conductor layer 2 are laminated together. To prevent this specific metal foil surface treatment measures are taken. These measures are shown at the larger scale detail A of FIG. 1.

Figure 2:
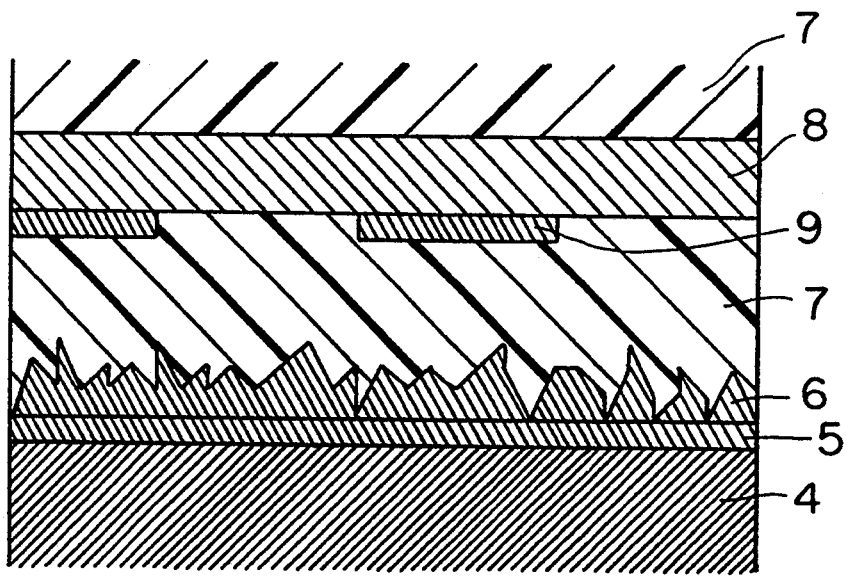
FIG. 2 is an enlarged partial view of detail A of FIG. 1 showing a "treatment" coating in accordance with the prior art.

FIG. 2 shows an enlarge view of detail A of FIG. 1 with a known surface treatment of the metal foil for improving the adhesion of the laminate. Thus, FIG. 2 shows the prior art. The upper part of the foil 3 is shown and comprises the Invar layer 4, the copper coating 5 and an electrodeposited "treatment" coating 6 with its rough surface. Above this can be seen the lower part of the laminated-on conductor layer 2 comprising the adhesive 7, the plastic carrier 8 and the electrically conductive connections 9 and this sequence can be repeated in the conductor layer 2.

Foils with a treatment coating are able to prevent delamination, but not in all cases. Moreover, although "treating" can be used on copper coatings, molybdenum or INVAR TM are too hard.

Figure 3A:
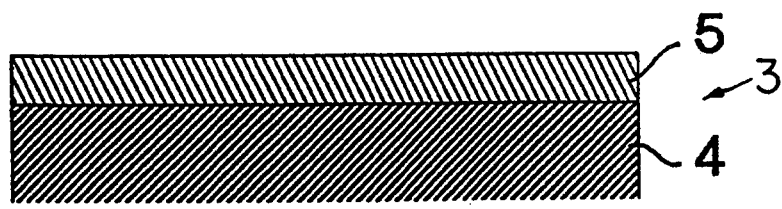
FIGS. 3a–3d are enlarged side elevations of layers of a printed circuit board showing steps of an embodiment of the invention referred to as a subtractive technique.

FIGS. 3a–3d show four successive steps in a method in accordance with the invention for producing a structured surface in the metal coating of one layer of a multilayer printed circuit board. FIG. 3a shows the starting material, in this case a metal foil 3 having a core part 4 covered with the metal coating 5. Such foils are commercially available and are typically formed from a composite of INVAR TM or molybdenum in the core part 4 and rolled on copper as the metal coating 5. A copper/INVAR TM foil is used in the example described manner hereinafter. The method steps are shown for one of the two copper coatings 5. However, the method can be readily used in the same operation on both sides. Considered individually, all the partial steps are known per se from other sequences for the production of printed circuit boards.

Figure 3B:
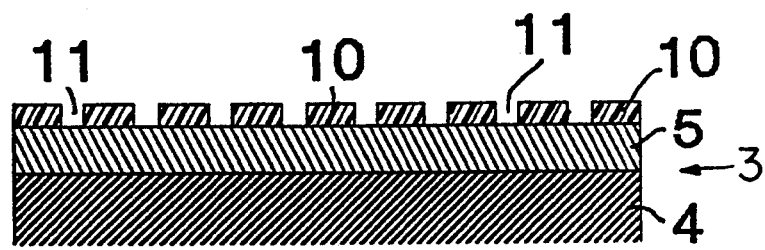

First a photoresist coating 10 is applied to the copper coating 5. The photoresist, usually a polymer, under the action of light locally changes its resistance to certain chemicals used for development, so that recesses can be produced in the photoresist coating. The photoresist is resistant to etchants for the metal which it covers. FIG. 3b shows the copper coating covered by the already exposed and developed photoresist coating 10. The latter has recesses 11 at the points where depressions are to be formed in the metal surface. The shape of the recesses can be freely selected. The dimensions are preferably approximately 50 to 100 micrometers.

Figure 3C:
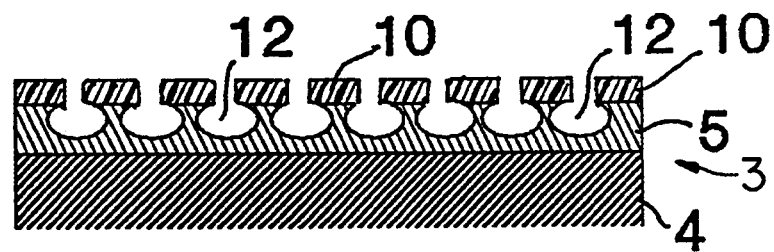

In the next step the copper is partly etched, i.e. it is not entirely etched away. At the locations of the recesses 11 in the photoresist coating 10, depressions 12 are formed in the underlying copper coating 5. FIG. 3c shows the situation following this partial step.

With the conventional etching process, preference being given to spray etching, the successive material removal commences at the surface uniformly over the entire opening in the photoresist. With progressive etching out depth, there is a slight expansion of the depression. This known undercutting leads in the case of the small depressions as produced here to a bulging cavity. The etching depth is decisively determined by the running speed or residence time of the workpiece in the etching process. These are known, readily controllable processes. Preferred depths are between 10 and 50 micrometers.

The undercutting in the etched-out depression is desired for the sought structuring purpose. After laminating on a further coating, the resin in the cavities hardens. This leads to a positive connection, which makes a separation of the coatings virtually impossible. Only the elasticity of the materials allows separation when very high forces are exerted by overcoming the pushbutton effect.

A further improvement regarding the shape of the depressions can be obtained by prior hardening of the surface of the copper coating with respect to the etchant. For this purpose, prior to the application of the photoresist, nickel is applied to the copper and diffused in by a heat treatment. The etching process through the top coating then initially takes place slowly until the hardened coating has been etched through and then there is a pronounced undercutting of the harder top coating. The overhanging edges of the depressions are thicker and stronger than in the previously described variant.

Figure 3D:
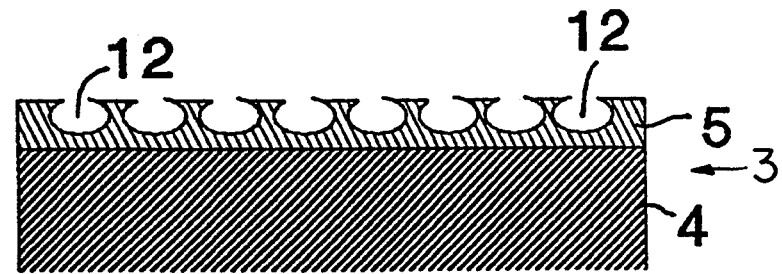

Following the etching, the photoresist is stripped, i.e. removed again in known manner. What is left behind is the original metal foil 2 with the recesses 12 in the copper coating 5 as shown in FIG. 3d which represents the desired structuring of the surface as regards pattern and shape.

In the subtractive method the copper coating is weakened, which must be taken into account for the electrical function if this is significant. This weakening has an advantageous effect with respect to the mechanical-thermal characteristics. As there is less copper with a comparatively high thermal expansion coefficient, the INVAR TM can even better fulfil its dimension-stabilizing action. Moreover, in its broken-away form the copper coating is less stiff than in the form of a uniform thick foil. The method is not restricted to copper coatings. Uncovered INVAR TM or molybdenum foils can also be appropriately structured in accordance with the above-described steps.

For the choice of the pattern and shape of the depression, decisive importance is attached to the characteristics of the materials used. In order to effectively counteract the shear forces, it may e.g. be advantageous to incorporate appropriate barriers. FIGS. 4a–4c are plan view of structured surfaces with possible patterns of the recesses 12 in three variants in an exemplified, but non-limitative manner.

According to another embodiment which is referred to herein as the additive method, protuberances of the material are electrodeposited on the metal coating 5, the associated steps being shown in FIG. 5. Starting takes place from the same method stage as described hereinbefore in conjunction with FIG. 3a. FIG. 5a again shows the copper/INVAR TM foil and FIG. 5b the state following the application, exposure and development of the photoresist 10 on the copper coating 5. The recesses 11 are here patterned and shaped in accordance with the protuberances applied at these locations. Otherwise the partial steps do not differ up to now from those of the subtractive method.

In a next step the copper is electroplated on. Copper protuberances 15 are formed in the recesses 11, in the manner shown in FIG. 5c. The thickness of the electroplated-on coating or islands, i.e. the protuberances 15, is determined by the duration and intensity of the electroplating process. Here again the pattern and shape of the protuberances can be freely selected. It has the major advantage that overhanging structures can be produced, as shown in FIG. 5d. The electroplating process is continued beyond the state of FIG. 5c. Copper is not only deposited in the recesses 11, but also, starting from the protuberances 15, over the photoresist coating 10. As a result, collars 16 are formed on the protuberances 15, which therefore acquire a mushroom-shaped configuration. After stripping the photoresist the mushroom-shaped protuberances 15 with their collars 16 are left behind, as shown in FIG. 5e. Following a subsequent method step, in which the next conductor is laminated on, the collars 16 bring about an extremely favourable anchoring of the resin or adhesive on the metal surface. However, electroplating can be stopped at the state of FIG. 5c and the photoresist stripped (not shown). This leads to similar structures and shapes to those of the subtractive method.

Generally additional requirements will decide the choice of method. Metal foils of the described type can fulfil thermal, electrical and mechanical functions. If exclusively a depression and a limited thermal expansion is sought, it is sufficient to have foils of Invar, molybdenum, etc. Both methods can be used and plating-on can e.g. take place with nickel or copper. If additionally a good electrical conductivity is sought, in order to obtain a screening effect, a copper coating, structured according to the subtractive method, may well be the correct choice. However, if the main significance is attached to the heat conduction function, then a relatively thick copper coating is appropriate and the additive method should be used.

With these photochemical methods it is readily possible to only structure parts of the foil and to recess other parts, which are subsequently e.g. not to be covered, but which are to provide a screening connection.

The method and the resulting product have been explained using the example of a copper/INVAR TM foil, as used as an intermediate layer in printed circuit boards. The delamination problem occurs most acutely on the said foil surface which, for producing a multilayer printed circuit board, is laminated together with another conductor layer. However, the method and resulting product are in no way limited to such intermediate layers. With the knowledge of the invention the expert is in a position to use the same for substrates formed in different ways.

We claim:

1. A method for producing a laminated structure having improved resistance to delamination by shear forces comprising, in sequence, the steps of
   providing a body having an exterior layer of metal with a surface to which a resin layer is to be attached,
   etching the surface of the layer of metal so that it has a pattern of openings through the surface, each opening having lateral dimensions, each opening leading to a cavity behind the surface which has lateral dimensions larger than the surface opening, and
   applying a layer of a resin to the etched metal surface so that the resin enters the cavities behind the surface openings, thereby interlocking the resin layer to the metal body to form a structure having resistance to separation by shear forces.

2. A method according to claim 1 wherein the step of etching includes covering the metal surface with a photoresist, exposing the photoresist to light in a pattern corresponding to the desired pattern of openings, developing the photoresist and removing exposed portions thereof to expose metal areas, etching the areas of the exposed metal surface to form openings, continuing the etching to form cavities behind the surface, and subsequently removing the remaining photoresist.

3. A method according to claim 2 wherein the body with a layer of metal comprises a core of a first material, a layer of copper foil bonded to a surface of the core with one surface of the copper foil exposed, the material of the core having a lower thermal coefficient of expansion than the copper, the method further including, before the step of etching, hardening the exposed surface of the copper foil by applying nickel thereto and diffusing the nickel into the copper with heat treatment, whereby the cavities are formed behind the hardened surface during the step of etching.

4. A method according to claim 1 including, before the step of etching, hardening the surface of the layer of metal whereby the cavities are formed behind the hardened surface during the step of etching.

5. A method according to claim 1 wherein the pattern is a regular pattern of openings having substantially uniform sizes and shapes.

6. A method for producing a laminated structure having improved resistance to delamination by shear forces comprising performing in sequence the steps of
providing a body having an exterior layer of metal with a surface to which a resin layer is to be attached, forming a plurality of metal protuberances on the surface of the layer of metal, each protuberance having, in cross-section, a portion extending away from the surface to a distal end and portions extending laterally from the distal end defining openings between the protuberances leading to cavities having lateral dimensions larger than the openings, and
applying a layer of a resin to the metal protuberances so that the resin enters the cavities behind the openings, thereby interlocking the resin layer to the body to form a structure having resistance to separation by shear forces.

7. A method according to claim 6 wherein the step of forming the protuberances includes, in sequence, covering the metal surface with a photoresist, exposing the photoresist to light in a pattern corresponding to the desired pattern of openings, developing the photoresist and removing exposed portions thereof to expose metal areas, plating metal onto the areas of the exposed metal surface to form protuberances on the metal surface, continuing the plating to form laterally extending portions on the protuberances, stopping the plating before the protuberances abut each other, and subsequently removing the remaining photoresist to leave a new surface with a pattern of openings therethrough leading to cavities behind the new surface.

8. A method according to claim 7 wherein said protuberances have mushroom-shaped heads in cross-section.

9. A method according to claim 6 wherein the body with a layer of metal comprises a core of a first material, a layer of metal foil bonded to a surface of the core with one surface of the metal foil exposed, the material of the core having a lower thermal coefficient of expansion than the metal.

10. A method according to claim 6 wherein the pattern is a regular pattern of openings having substantially uniform sizes and shapes.

* * * * *